US009092102B2

(12) United States Patent
Kono et al.

(10) Patent No.: US 9,092,102 B2
(45) Date of Patent: Jul. 28, 2015

(54) TOUCH SWITCH

(75) Inventors: Katsumasa Kono, Shiga (JP); Keisaku Kimura, Shiga (JP)

(73) Assignee: GUNZE LIMITED, Kyoto (JP)

(*) Notice: Subject to any disclaimer, the term of this patent is extended or adjusted under 35 U.S.C. 154(b) by 121 days.

(21) Appl. No.: 13/821,930

(22) PCT Filed: Oct. 18, 2011

(86) PCT No.: PCT/JP2011/073891
§ 371 (c)(1),
(2), (4) Date: Mar. 8, 2013

(87) PCT Pub. No.: WO2012/053498
PCT Pub. Date: Apr. 26, 2012

(65) Prior Publication Data
US 2013/0162596 A1  Jun. 27, 2013

(30) Foreign Application Priority Data

Oct. 18, 2010  (JP) ................................. 2010-233897
Dec. 17, 2010  (JP) ................................. 2010-282335

(51) Int. Cl.
*G06F 3/044* (2006.01)
(52) U.S. Cl.
CPC ...... *G06F 3/044* (2013.01); *G06F 2203/04103* (2013.01); *G06F 2203/04112* (2013.01)
(58) Field of Classification Search
USPC ............ 345/87, 173–175; 349/12, 23, 24, 41, 349/42, 49; 178/18.01–18.09
See application file for complete search history.

(56) References Cited

U.S. PATENT DOCUMENTS

| | | | |
|---|---|---|---|
| 2004/0238726 A1* | 12/2004 | Caldwell | 250/221 |
| 2008/0007534 A1* | 1/2008 | Peng et al. | 345/173 |
| 2008/0018613 A1* | 1/2008 | Kim et al. | 345/173 |
| 2008/0224900 A1 | 9/2008 | Konno et al. | |
| 2008/0265788 A1 | 10/2008 | Yamauchi et al. | |
| 2009/0153509 A1 | 6/2009 | Jiang et al. | |
| 2010/0182275 A1 | 7/2010 | Saitou | |
| 2011/0102370 A1 | 5/2011 | Kono et al. | |

FOREIGN PATENT DOCUMENTS

| | | |
|---|---|---|
| CN | 101295974 A | 10/2008 |
| JP | S52-093476 U | 7/1977 |

(Continued)

OTHER PUBLICATIONS

International Search Report of the International Searching Authority mailed Nov. 22, 2011 for the corresponding international application No. PCT/JP2011/073891.

*Primary Examiner* — Shaheda Abdin
(74) *Attorney, Agent, or Firm* — Posz Law Group, PLC

(57) ABSTRACT

The object of the present invention is to provide a touch switch that enables reduction in the low-sensitivity region where the contact by fingers cannot be detected. The touch switch of the present invention comprises an insulating layer; sensor electrodes as a plurality of first electrodes provided on one surface of the insulating layer; a plurality of wire portions provided on one surface of the insulating layer, individually connected to the sensor electrodes; and auxiliary electrodes as a plurality of second electrodes provided on the other surface of the insulating layer, each auxiliary electrode being provided in a portion opposite each sensor electrode, wherein a boundary of adjacent auxiliary electrodes is provided in a region between adjacent sensor electrodes.

10 Claims, 14 Drawing Sheets

(56) References Cited

FOREIGN PATENT DOCUMENTS

| JP | S58-087234 U | 6/1983 |
| JP | 11-134987 A | 5/1999 |
| JP | 2008-226729 A | 9/2008 |
| JP | 2009-146419 A | 7/2009 |
| JP | 2010-039537 A | 2/2010 |
| JP | 2010-170163 A | 8/2010 |

* cited by examiner (a)　　　　　　　　　　　　　(b)

(a)　　　　　　　　　　　　　(b)

TOUCH SWITCH

CROSS REFERENCE TO RELATED APPLICATIONS

The present application is a U.S. national stage of PCT/JP2011/073891 filed on Oct.18, 2011, and claims priority to, and incorporates by reference, Japanese Patent Application No. 2010-233897 filed on Oct.18, 2010 and Japanese Patent Application No. 2010-282335 filed on Dec.17, 2010.

TECHNICAL FIELD

The present invention relates to a capacitive touch switch.

BACKGROUND ART

Known touch switches are generally classified into types that detect a change in light, and types that detect a change in electrical characteristic. Touch switches based on change in electrical characteristic include capacitive coupling touch switches. Patent Document 1 discloses an example of a capacitive coupling touch switch in which a plurality of sensor electrodes is laid out on a substrate. Each sensor electrode is connected to a conductive wire (wire portion) that is connected to a capacitance detection circuit. When a user touches one of the sensor electrodes with a finger, the capacitance detection circuit detects the capacitance change due to the capacitance of the human body, thereby specifying the touched position. At this time, by detecting the value of the electric current in the sensor electrode, it is possible to calculate the touched position.

CITATION LIST

Patent Document

PTD 1: Japanese Unexamined Patent Application Publication No. 2009-146419

SUMMARY OF INVENTION

Technical Problem

In the above touch switch, both the sensor electrodes and conductive wires (wire portion) are laid out on a substrate. Therefore, the more sensor electrodes that are provided, the more conductive wires (wire portion) are required. Thus, it is necessary to ensure the space for conductive wires (wire portion) on the substrate. However, the space for conductive wires (wire portion) is less sensitive with respect to touching actions with fingers or conductive touch pens; thus, considering the function as a touch switch, this portion must be minimized. Such minimization is possible by using thin conductive wires (wire portion); however, there is a limitation regarding the extent to which the number of conductive wires (wire portion) can be increased.

The present invention was made in view of the above problems, and an object is to provide a touch switch in which such a low-sensitivity region unresponsive to touching actions with fingers or conductive touch pens can be minimized.

Solution to Problem

A touch switch according to the present invention comprises: a substrate; a plurality of transparent wire electrodes as first electrodes formed on the substrate, each wire electrode having a conductive wire and a conductive area connected to the conductive wire; an insulating layer that covers the wire electrodes, the insulating layer having at least one contact hole formed on the conductive area of each wire electrode; and a plurality of transparent sensor electrodes as second electrodes formed on the insulating layer, each sensor electrode being formed in a portion corresponding to the conductive area of each wire electrode and being electrically connected to the conductive area via the contact hole.

In this structure, the sensor electrodes (second electrodes) are formed on the wire electrodes (first electrodes) having the conductive wires via an insulating layer; the wire electrodes are electrically connected to the sensor electrodes via the contact holes formed on the insulating layer. More specifically, the sensor electrodes are formed on a layer different from the layer on which the wire electrodes are formed; therefore, it is not necessary to keep the space for the conductive wires on the layer on which the sensor electrodes are provided. Accordingly, it becomes possible to more efficiently dispose the multiple sensor electrodes in terms of reduction in the low-sensitivity region. Moreover, as long as the electrical connection between the wire electrodes and the sensor electrodes are ensured via the contact holes, the wire electrodes can be freely laid out regardless of the layout of the sensor electrodes. Accordingly, the layout of the conductive wires becomes more flexible, thereby enabling various wiring designs. An example of the layout is one in which at least a part of the multiple conductive areas is provided in two lines, and in which the conductive wires extending from the conductive areas are disposed between the two lines of conductive areas. With this structure, each conductive wire can be lead from one portion, thereby increasing the flexibility of the circuit layout.

The above touch switch is preferably structured such that the sensor electrodes are densely-arranged in an upper portion of a reference region of the substrate where the wire electrodes are provided. With this structure, it becomes possible to reduce the gaps between the adjacent sensor electrodes, thereby reducing the low-sensitivity region. The reference region designates a region having at least a conductive region in each wire electrode; the region is to be touched with fingers, conductive touch pens, and the like. For example, when the touch switch is provided on a display device, the region corresponding to the entire display screen of the display device or a part of the display screen for the operation is referred to as a reference region.

The above touch switch is preferably structured such that gaps between the adjacent sensor electrodes are 10 μm to 3 mm, more preferably 100 μm to 2 mm, further preferably 0.5 mm to 1.5 mm. As described above, because the adjacent sensor electrodes can be arranged regardless of the layout of the conductive wires, the gaps between the adjacent sensor electrodes can thus be reduced. A length outside the above range may also be adopted; however, if the interval is 10 μm or less, stable insulation between the adjacent sensor electrodes may be impaired. Further, if the interval is 3 mm or more, the low-sensitivity region becomes too large relative to the size of a finger; thus, detection may become unstable. It is not necessary to completely equalize the gap between the sensor electrodes for each of the adjacent sensor electrodes; for example, the gaps may vary as necessary.

In the above touch switch, the sensor electrodes can be formed into various shapes. For example, it is possible that at least a part of an edge of each sensor electrode forms in-plane irregular patterns, and that a boundary of adjacent sensor electrodes is formed by engaging the irregular patterns at predetermined intervals. With this structure, it is possible to increase the sensitivity in the detection of the contact by fingers in the boundary of the adjacent sensor electrodes.

Another touch switch according to the present invention comprises: an insulating layer; a plurality of sensor electrodes as first electrodes provided on one surface of the insulating layer; a plurality of wire portions provided on one surface of the insulating layer, individually connected to the sensor electrodes; a plurality of auxiliary electrodes as second electrodes provided on the other surface of the insulating layer, each auxiliary electrode being provided in a portion opposite each sensor electrode; and an insulating protection layer that covers the auxiliary electrodes, wherein a boundary of adjacent auxiliary electrodes is provided in a region between adjacent sensor electrodes.

In this structure, the auxiliary electrodes (second electrodes) are formed in the portions opposite the sensor electrodes (first electrodes) via the insulating layer; further, the boundary of the adjacent auxiliary electrodes resides in a region between the adjacent sensor electrodes. Therefore, even if the low-sensitivity region is enlarged because of the gaps between the sensor electrodes or the wire portions that are provided between the sensor electrodes, by disposing the boundary of the auxiliary electrodes in the low-sensitivity region, the low-sensitivity region is covered by the auxiliary electrodes. Accordingly, the low-sensitivity region is reduced, and the decrease in detection sensitivity can be prevented even when fingers or conductive touch pens touch the region between the sensor electrodes. For example, the more sensor electrodes that are provided, the more wire portions are required, thereby enlarging the low-sensitivity region. However, by covering the wire portions with auxiliary electrodes, the low-sensitivity region can be reduced. Although the present invention states that "the boundary of the adjacent auxiliary electrodes resides in a region between the adjacent sensor electrodes," the boundary of the auxiliary electrodes is not necessarily strictly disposed in the region between the sensor electrodes. That is, "a region between the adjacent sensor electrodes" also includes the vicinity of the region. As such, the position of the boundary can vary slightly, unless the detection sensitivity greatly decreases.

The above touch switch is preferably structured such that the auxiliary electrodes are densely-arranged in an upper portion of a reference region where the sensor electrodes are provided. Accordingly, it becomes possible to reduce the gaps between the adjacent auxiliary electrodes, thereby reducing the low-sensitivity region. The reference region designates a region having at least a sensor electrode; the region is to be touched with fingers, conductive touch pens, and the like. For example, when the touch switch is provided on a display device, the region corresponding to the entire display screen of the display device or a part of the display screen for the operation is referred to as a reference region.

The above touch switch can be structured such that gaps between the adjacent auxiliary electrodes are 10 μm to 3 mm, more preferably 100 μm to 2 mm, and further preferably 0.5 mm to 1.5 mm. As described above, because the auxiliary electrodes can be arranged regardless of the wire layout of the wire portions, the gaps between the adjacent auxiliary electrodes can thus be reduced. A length outside the above range may also be adopted; however, if the interval is 10 μm or less, stable insulation between the adjacent auxiliary electrodes may be impaired. Further, if the interval is 3 mm or more, the low-sensitivity region becomes too large relative to the size of a finger; thus, the detection may become unstable. It is not necessary to completely equalize the gap between the auxiliary electrodes for each of the adjacent auxiliary electrodes; for example, the gaps may vary as necessary.

The above touch switch can be structured such that the sensor electrodes are formed of a metal wire mesh, or such that the wire portions are formed of at least one metal wire. With this structure using a metal wire, it is possible to obtain sensor electrodes with light permeability and low surface resistivity.

In the above touch switch, the auxiliary electrodes can be formed into various shapes. For example, it is possible that at least a part of an edge of each auxiliary electrode forms in-plane irregular patterns, and that a boundary of adjacent auxiliary electrodes is formed by engaging the irregular patterns at predetermined intervals. With this structure, it is possible to increase the sensitivity in the detection of the contact by fingers in the boundary of the adjacent auxiliary electrodes.

The above touch switch can be structured such that the sensor electrodes have substantially identical areas. With this structure, the electrostatic capacity between each sensor electrode and each auxiliary electrode can be equalized, thereby equalizing detection sensitivity at each point where the contact by fingers or the like is detected. However, it is not necessary to completely equalize the areas of the sensor electrodes; the areas may slightly vary insofar as the detection sensitivity is similar.

The touch switch according to the present invention enables reduction in the low-sensitivity region where the contact by fingers cannot be detected.

Advantageous Effects of Invention

The present invention provides a touch switch in which a low-sensitivity region unresponsive to touching actions with fingers can be minimized.

DESCRIPTION OF EMBODIMENTS

Figure 1:
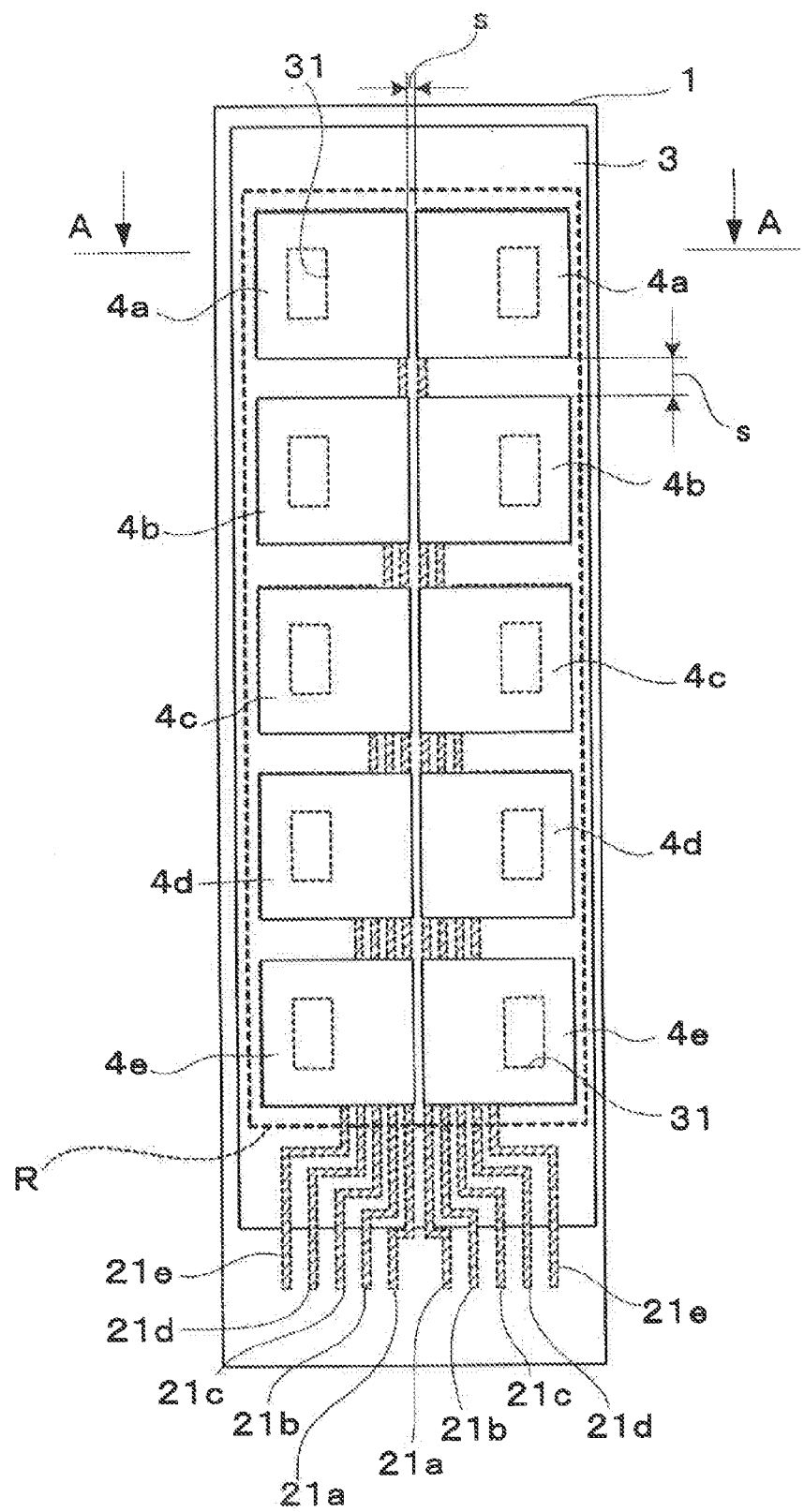
FIG. 1 A plan view of a touch switch according to a First Embodiment of the present invention.
Figure 2:
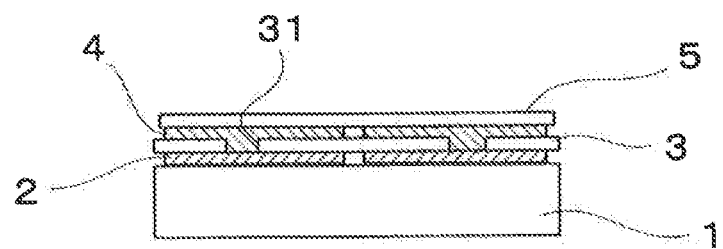
FIG. 2 A cross-sectional view taken along Line A-A in FIG. 1.
Figure 3:
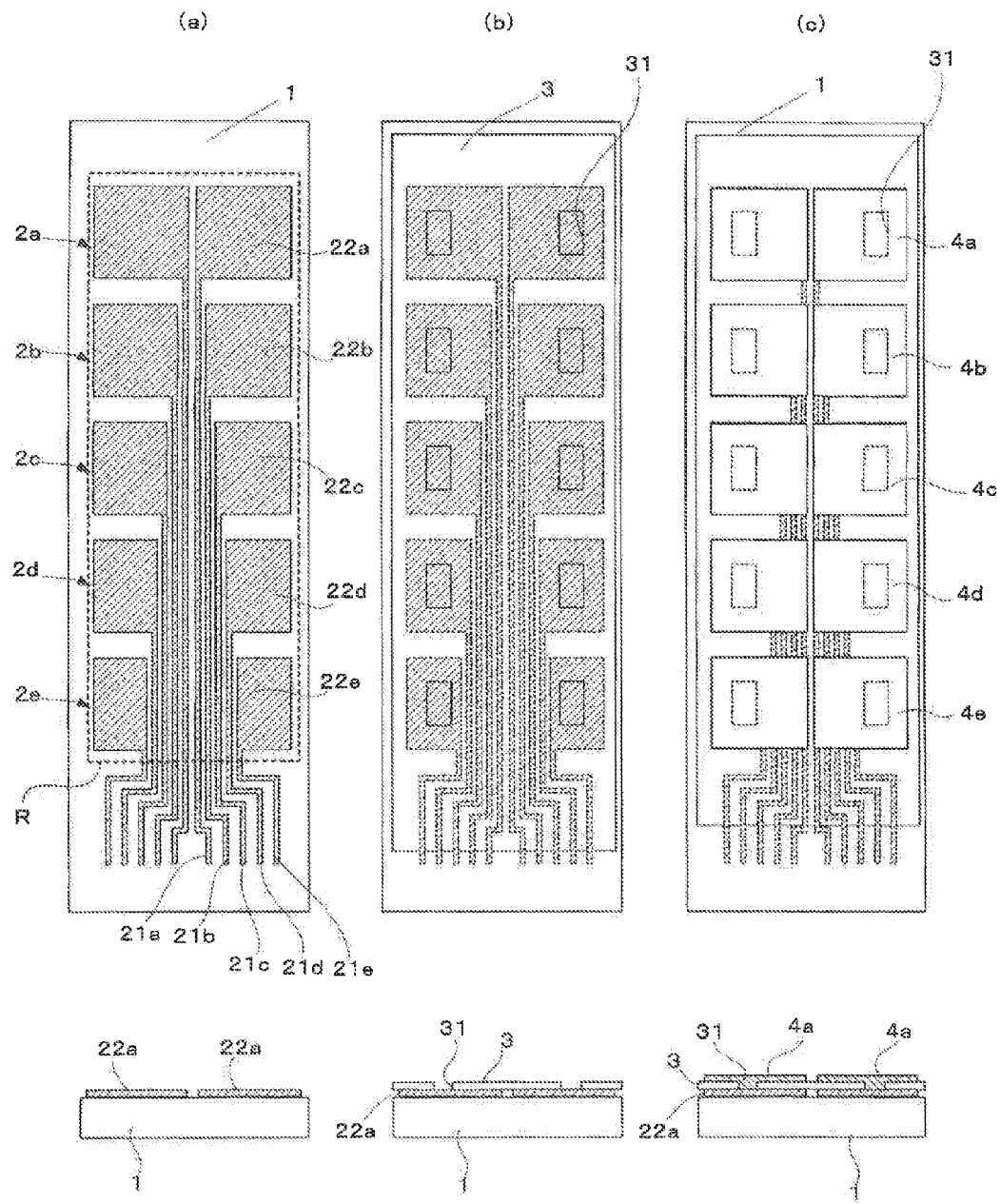
FIG. 3 A plan view and a cross-sectional view showing a production method of the touch switch in FIG. 1.

Hereunder, the First Embodiment of the touch switch of the present invention is described in reference to attached drawings. FIG. 1 is a plan view of the touch switch; FIG. 2 is a cross-sectional view taken along Line A-A in FIG. 1; and FIG. 3 illustrates a plan view and a cross-sectional view showing a production method of the touch switch in FIG. 1. For convenience, the later-described protection layer is not illustrated in FIG. 1.

The touch switch according to the First Embodiment is a capacitive touch switch that is provided on an upper surface of a display device such as a liquid-crystal panel. As shown in FIGS. 1 and 2, the touch switch has a transparent substrate 1 on which wire electrodes 2 (first electrodes), an insulating layer 3, sensor electrodes 4 (second electrodes), and a protection layer 5 are layered in this order. A plurality of wire electrodes 2 are provided on the substrate 1. As shown in FIG. 3(a), each wire electrode 2 is composed of a conductive wire 21, and a rectangular conductive region 22 that is connected to one end of the conductive wire 21. In the wire electrode 2, at least the conductive region 22 is provided in a reference region R to be touched with fingers, conductive touch pens, and the like. Each conductive wire 21 extends toward the end portion of the substrate 1, and the other end of the conductive wire 21 is connected to a capacitance detection circuit (not illustrated in the figure). Considering the length and the width of the conductive wire 21, the wire electrode 2 preferably has a low resistance. For example, the surface resistivity of the wire electrode 2 is preferably not more than 10 Ω/sq. In the present embodiment, 10 wire electrodes 2 are provided on the substrate 1; more specifically, two lines of 5 wire electrodes 2 are aligned in the column-wise direction of FIG. 1 and FIG. 3(a). Here, for convenience, these 5 wire electrodes 2 are referred to as first to fifth wire electrodes 2a to 2e from the top to bottom of FIG. 1 and FIG. 3(a). Because these 5 wire electrodes 2 are identical in each line, the wire electrodes on the right-hand side of FIG. 3(a) are described below. Further, for convenience, the column-wise direction in FIG. 1 and FIG. 3(a) is referred to as the longitudinal direction, and the row-wise direction in FIG. 1 and FIG. 3(a) is referred to as the width direction.

As shown in FIG. 3(a), the first wire electrode 2a is provided on one longitudinal end (an upper portion in FIG. 3) of the substrate 1. The first wire electrode 2a has a square conductive region 22a, and a conductive wire 21a extending straight from the left end of the conductive region 22a toward the other end (a lower portion in FIG. 3) of the longitudinal direction. The second wire electrode 2b is provided closer to the other longitudinal end than the first wire electrode 2a. The width-wise length of the second wire electrode 2b is smaller than that of the conductive region 22a of the first wire electrode 2a. More specifically, the conductive regions 22a and 22b are disposed with their right width-wise ends aligned in line; however, the left end of the second conductive region 22b is disposed to the right of the conductive wire 21a of the first wire electrode 2a so that the second conductive region 22b does not come in contact with the conductive wire 21a. The conductive wire 21b of the second wire electrode 2b extends straight from the left end of the conductive region 22b toward the other end of the longitudinal direction in parallel with the conductive wire 21a of the first wire electrode 2a. Similarly, from the third to fifth wire electrodes 2c to 2e, the width of the conductive region is gradually reduced so as to avoid contact with the conductive wires of adjacent wire electrodes at an end of the longitudinal direction. The conductive region 22e of the fifth wire electrode 2e has the smallest area. Further, the conductive wires 21a to 21e are flexed at an end of the substrate 1 into an L-shape, and thereby ensure large gaps therebetween in the end of the substrate 1. Insofar as they ensure electrical connection with sensor electrodes 4 via the contact holes 31, the conductive regions 22a to 22e may have the same widths as those of the conductive wires 21a to 21e.

Further, an insulating layer 3 is formed to cover the wire electrodes 2a to 2e having the above structure (see FIG. 3(b)). The insulating layer 3 has a film thickness of, for example, 1 to 300 μm, and a plurality of contact holes 31. The contact holes 31 individually correspond to the conductive regions 22a to 22e of the wire electrodes 2a to 2e. A part of each of the conductive regions 22a to 22e is exposed to the surface via a corresponding contact hole 31.

The contact holes 31 are smaller than the conductive regions 22a to 22e. For example, assuming that the contact hole 31 has a circular shape, the outer diameter is preferably 1 to 100 μm, more preferably 5 to 20 μm. This is because if the outer diameter is smaller than 1 μm, the electrical connection between the conductive regions 22a to 22e and the sensor electrodes 4 (described later) is not ensured; if the outer diameter is greater than 100 μm, the contact holes 31 may reside outside the conductive regions 22a to 22e, or may become visible. The size of the contact hole 31 is appropriately determined according to the thickness of the insulating layer 3 so as to ensure the electrical connection between the wire electrodes 2 and the sensor electrodes 4.

Next, the sensor electrodes 4 are described below. As with the wire electrodes 2, 10 sensor electrodes 4 are provided. More specifically, two lines of 5 sensor electrodes 4 are aligned in the column-wise direction of FIG. 1. Similarly to the above description of the wire electrodes, these 5 sensor electrodes 4 are referred to as first to fifth sensor electrodes 4a to 4e from the top to bottom of FIG. 1. Because these 5 sensor electrodes 4 are identical in each line, the sensor electrodes on the right-hand side of FIG. 1 are described below. When the sensor electrodes 4a to 4e are made of indium tin oxide (ITO), each of the sensor electrodes 4a to 4e has a film thickness of 10 to 100 nm, and is disposed on a corresponding one of the conductive regions 22a to 22e of the wire electrodes 2a to 2e on the insulating layer 3. All sensor electrodes 4a to 4e are formed into an identical square, and are disposed with narrow intervals. As shown in FIG. 2, the sensor electrodes 4a to 4e are in contact with the conductive regions 22 via the contact holes 31 in the insulating layer 3. More specifically, the first to fifth sensor electrodes 4a to 4e are electrically connected to the first to fifth wire electrodes 2a to 2e, respectively. The surface resistivity of the sensor electrodes 4 may be higher than that of the wire electrodes 2. For example, the surface resistivity is not more than 1 kΩ/sq., more preferably not more than 300 Ω/sq. The multiple sensor electrodes 4 arranged as above are covered with the protection layer 5.

Further, as shown in FIG. 1, the length "s" of an interval between adjacent sensor electrodes 4 is 10 μm to 3 mm, preferably 100 μm to 2 mm, and more preferably 0.5 mm to 1.5 mm. A length outside the above range may also be adopted; however, if the interval is 10 μm or less, stable insulation between the adjacent sensor electrodes 4 may be impaired. Further, if the interval is 3 mm or more, the low-sensitivity region becomes too large relative to the size of a finger; thus, the detection may become unstable. It is not necessary to equalize the length "s" between the sensor electrodes 4 for each of the adjacent sensor electrodes 4; for example, the length "s" may vary depending on the position.

Next, the materials of the aforementioned members are described below. The material of the substrate 1 is not limited. The substrate 1 may be made of various materials including transparent inorganic or organic materials, and organic/inorganic hybrid materials. For example, organic materials are preferable in terms of being lightweight and impact resistant, and plastic films are preferable in terms of flexibility and productivity in the roll-to-roll method. Examples of plastic films include polyethylene terephthalate (PET), polyethylene naphthalate (PEN), acryl (FNMA), and polycarbonate (PC). However, these materials are not used untreated, but are processed to be provided with an anchor layer, such as a silane coupling layer, for improved adherence; surface-treated using corona treatment or plasma treatment; or processed to be provided with a hard-coated layer for scratch resistance or improved chemical resistance.

The wire electrodes 2 and the sensor electrodes 4 may be formed of various hitherto-known materials, and the materials thereof are not particularly limited. The materials of the wire electrodes 2 and the sensor electrodes 4 may be selected from preferable materials in view of the desired properties such as electrical connection or transparency. Examples of the materials of the wire electrodes 2 and the sensor electrodes 4 include metals such as aluminum, silver or copper, and metal oxide materials such as indium tin oxide (ITO), zinc oxide (ZnO), or tin oxide ($SnO_2$). Further, other metals such as aluminum, gallium, or titanium may be added to the metal oxide materials. Additionally, organic materials including transparent conductive polymers such as PEDOT/PSS, or metal or carbon fine conductive fibers may also be used as electrode materials solely, or in a combination of two or more. As described above, the surface resistivity of the wire electrodes 2 is supposed to be low. Therefore, each wire electrode 2 may have a three-layer structure in which a silver layer is sandwiched between two ITO layers.

The insulating layer 3 is not particularly limited insofar as it is transparent and nonconductive. However, the insulating layer 3 preferably has a high adherence with respect to the sensor electrodes 4 and the wire electrodes 2 respectively disposed thereon and thereunder. Further, the insulating layer 3 preferably has an appropriate shape and a film thickness that enables electrical connection with the sensor electrodes 4 and the wire electrodes 2 via the contact holes 31.

The protection layer 5 may be formed of a hitherto-known transparent material for general touch switches. The protection layer 5 may be formed of, for example, silicon nitride, silicon dioxide, benzocyclobutene (BCE), polyester, acrylic acid, or the like. The protection layer 5 may also be provided with a layer of glass or surface-treated resin film such as PET.

Next, a production method of the touch switch having the above structure is described below in reference to FIG. 3. As shown in FIG. 3(a), a plurality of wire electrodes 2 serving as the first electrodes are formed on the substrate 1. Various methods may be used to form the wire electrodes 2, including a method of forming a wire electrode material on the entire surface of the substrate 1, followed by patterning. Examples of the method of forming a wire electrode material include dry coating methods such as vacuum evaporation, sputtering or CVD, and wet coating methods such as gravure coating or spray coating. The patterning method is not limited; however, examples thereof include photolithography and laser etching. Photolithography is a technique of removing films using chemical agents, and laser etching is a technique of removing films using absorption of a laser beam of a specific wavelength. The patterning of the wire electrodes 2 preferably makes the electrode invisible (i.e., the presence/absence of the electrodes becomes invisible); therefore, it is preferable to perform the patterning using laser etching using YAG third harmonic capable of removing a film of 10 μm or smaller thickness. Laser etching has advantages over photolithography in terms of, for example, a small environmental burden, reduction in the number of steps due to no use of chemical agents, and convenience in the wiring design due to its patterning from CAD data without using a photomask. It is also possible to form a thin wire pattern using a silver paste or the like by screen printing or the like.

Next, as shown in FIG. 3(b), the insulating layer 3 is formed by covering the entire area of the wire electrodes 2. At this time, the contact holes 31 are formed in the portions corresponding to the conductive regions 22. The formation of the insulating layer 3 and the contact holes 31 may be performed using the same method as that for the wire electrodes 2.

Next, as shown in FIG. 3(c), the sensor electrodes 4 serving as the second electrodes are formed on the insulating layer 3. Here, the sensor electrodes 4 are individually in contact with the conductive regions 22 of the wire electrodes 2 via the contact holes 31 of the insulating layer 3, and thereby establish electric connection with the conductive regions 22. The formation of the sensor electrodes 4 may be performed using the aforementioned method for forming the wire electrodes 2. When the sensor electrodes 4 on the insulating layer 3 are laser-etched, it is necessary to ensure that the wire electrodes 2 under the insulating layer 3 do not absorb the wavelength of the laser light. Therefore, it is necessary to suitably perform the patterning of the wire electrodes 2 and the sensor electrodes 4 in an appropriate order in consideration of the materials. Finally, the protection layer 5 is formed on the sensor electrodes 4. The protection layer 5 may be formed using a usual method.

The touch switch thus structured is used as follows. The touched portion is detected using the hitherto-known detection technique for capacitive touch switches; more specifically, the coordinate of the touched position, which is an arbitrary position on the surface of the protection layer 5 touched with a finger or the like, is specified by detecting a change in electrostatic capacity.

As described in the above First Embodiment, the sensor electrodes 4 are formed on a layer different from the layer on which the wire electrodes 2 are formed; therefore, it is not necessary to keep the space for the conductive wires 21 on the layer on which the sensor electrodes 4 are provided. More specifically, the layer of the sensor electrodes 4 can be formed only in consideration of the layout of the sensor electrodes 4. Accordingly, it becomes possible to more efficiently dispose the multiple sensor electrodes 4 in terms of reduction in the low-sensitivity region. This is particularly effective to reduce the distance "s" between the sensor electrodes 4. Moreover, as long as the electrical connection between the wire electrodes 2 and the sensor electrodes 4 are ensured via the contact holes 31, the conductive wires 21 can be freely laid out regardless of the layout of the sensor electrodes 4. Accordingly, the layout of the conductive wires 21 becomes more flexible, thereby enabling various wiring designs.

Figure 4:
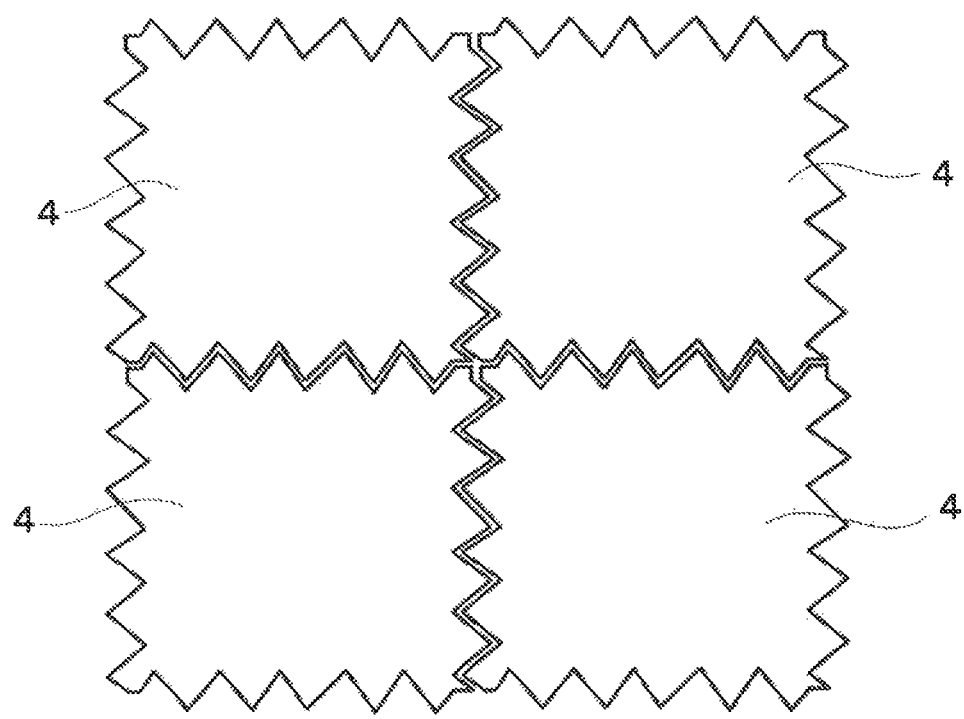
FIG. 4 A plan view showing another example of sensor electrodes of the touch switch in FIG. 1.

The present invention is not limited to the preceding First Embodiment, but embraces all variants within the intended scope of the invention. For example, although the First Embodiment describes a case where the conductive regions 22 and the sensor electrodes 4 have rectangular shapes, they may have other various shapes, including polygonal, circular, and irregular shapes. Further, although the First Embodiment describes a case where a linear gap is provided between two adjacent sensor electrodes 4, the boundaries between the sensor electrodes 4 may be made by forming an in-plane irregular pattern on the edge of each sensor electrode 4, and engaging these irregular patterns. For example, as shown in FIG. 4, it is possible to form a plurality of sharp projections on the edges of the sensor electrodes 4, and engage them together. With this structure, the detection sensitivity can be increased compared with the case of forming linear gaps between the sensor electrodes 4. More specifically, in this structure in which irregular patterns are formed on the edges of the sensor electrodes 4, when the user touches a boundary with a finger, the finger is more likely to come in contact with one of the adjacent sensor electrodes 4, thereby increasing the detection sensitivity. The irregular patterns are not limited to the above sharp patterns, and can be various shapes including rectangular shapes, corrugated shapes and the like.

Further, although the First Embodiment describes a case where one contact hole 31 is formed for each conductive region 22, the present invention is not limited to this structure. For example, a plurality of contact holes 31 may be formed for each conductive region 22. Additionally, the contact holes 31 are not limited to the above rectangular shapes, and can be formed into various shapes, including circular shapes.

Further, although the First Embodiment describes a case of forming a protection layer 5, the protection layer 5 is optional. When the protection layer 5, or a similar film, plate, and the like is formed, the above production method may be performed in reverse order. For example, the production can be performed by forming the sensor electrodes 4, the insulating layer 3, the wire electrode 2, and the substrate 1 in this order on the protection layer 5. Also in this case, each component can be formed in the same manner as above.

Furthermore, although the First Embodiment describes a case where the gaps between the longitudinally adjacent sensor electrodes 4 are wider than the gaps between the widthwise adjacent sensor electrodes 4, it is also possible to, for example, as shown in FIG. 4, form the sensor electrodes 4 on an upper portion of the reference region R with gaps reduced both in the longitudinal and width-wise lengths.

Hereunder, an example of the First Embodiment of the present invention is described. However, the First Embodiment is not limited to the example below.

In the present example, the touch switch shown in FIG. 1 was produced. More specifically, wire electrodes, an insulating layer, and sensor electrodes are formed in this order on a substrate. The substrate is made of a polyolefin-based film having a thickness of 100 μm. The wire electrodes are formed on the substrate.

First, to form the wire electrodes, an ITO film having a thickness of 30 to 40 nm was formed using DC magnetron sputtering. Then, a silver alloy containing silver (the main component) palladium and copper having a thickness of 10 nm or less, and an ITO film having a thickness of 30 to 40 nm were subsequently layered thereon. Thereby, a wire electrode as a lamination of three layers was formed. The wire electrode was a transparent electrode having a surface resistivity of not more than 10 Ω/sq., and a total light permeability of about 80%.

The wire electrode was patterned by laser etching using YAG third harmonic.

Next, an insulating layer was formed. In this embodiment, a commercially available NSC-2451 hard-coating composition (Nippon Fine Chemicals) was used. First, a commercially available OFPR-800LB positive resist (Tokyo Ohka Kogyo Co., Ltd.) was applied by spin-coating, followed by 5 minutes of hot-air prebaking at 80° C. thereby obtaining a resist film having a film thickness of 1.9 μm. Then, the portions to be provided with the contact holes were exposed to UV light for 20 seconds at about 50 mJ/cm$^2$, and then immersed in a developer (NMD-3) for about 30 seconds at room temperature to remove the parts other than photosensitive portions, followed by hot-air post-baking for 10 minutes at 80° C. Thereafter, the NSC 2451 composition was applied using a Meyer bar #12, followed by hot-air drying (thermal curing) for 90 seconds at 120° C., thereby obtaining a coating film having a thickness of 3.5 μm. The resulting coating film was immersed in 4% sodium hydroxide aqueous solution for 5 minutes at room temperature, thereby removing the resist and the NSC 2451 coating film of the contact holes.

Subsequently, the sensor electrodes were formed. More specifically, an ITO film was formed using DC magnetron sputtering. This ITO film had a film thickness of 30 nm and a surface resistivity of 200 to 300 Ω/sq. As in the insulating layer, patterning was performed by photolithography using a positive resist. A touch switch according to the present embodiment was thus completed.

Figure 5:
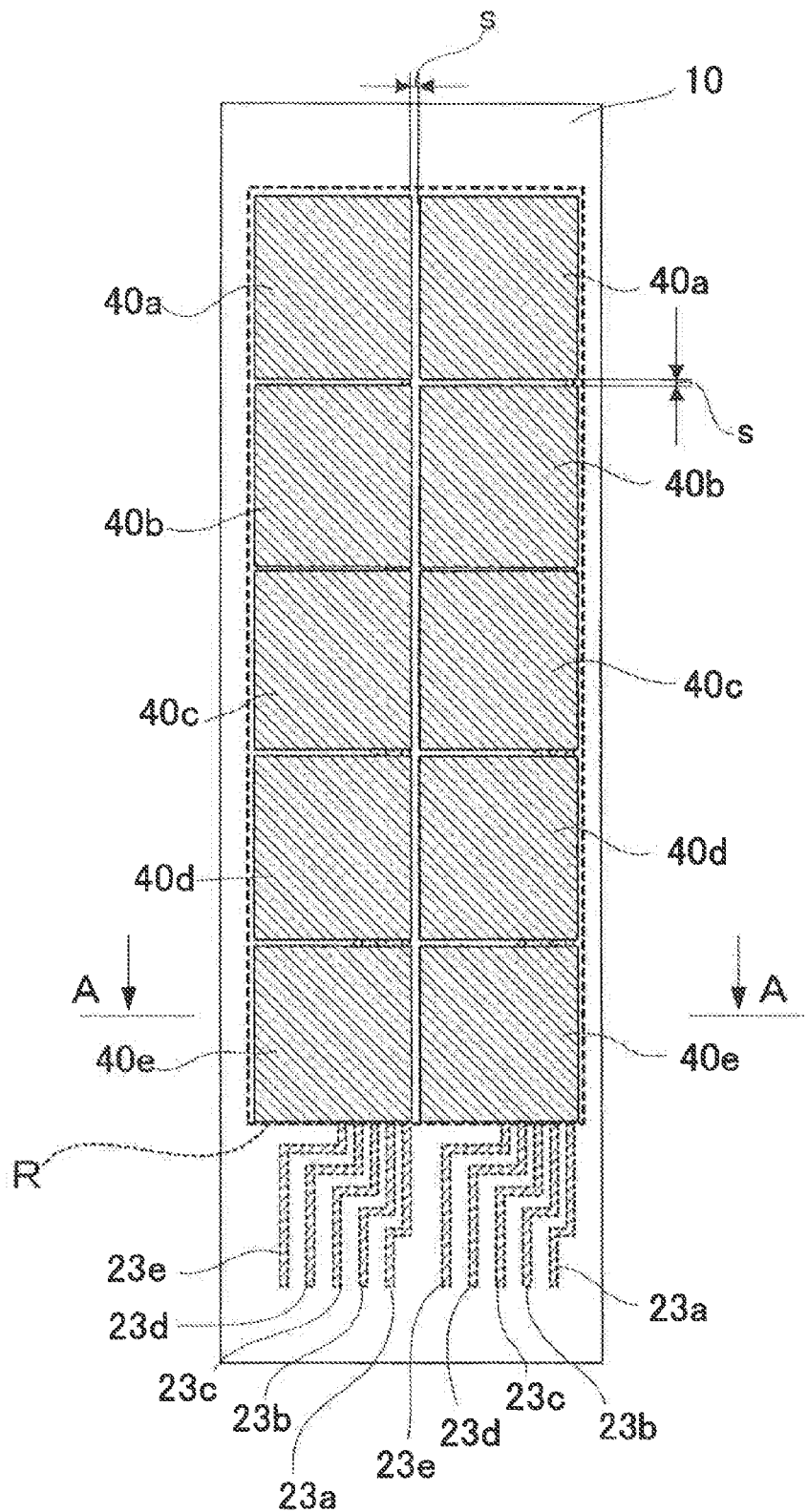
FIG. 5 A plan view of a touch switch according to a Second Embodiment of the present invention.
Figure 6:
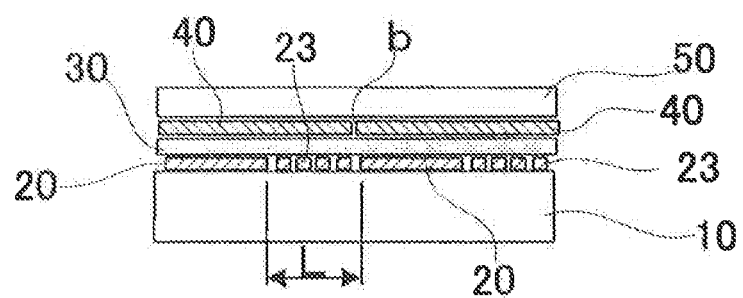
FIG. 6 A cross-sectional view taken along Line A-A in FIG. 5.

Next, the Second Embodiment of the touch switch of the present invention is described below in reference to attached drawings. FIG. 5 is a plan view of the touch switch, FIG. 6 is a cross-sectional view taken along Line A-A in FIG. 5, and FIG. 7 to FIG. 9 are plan views and cross-sectional views showing a production method of the touch switch in FIG. 5. For convenience, the later-described protection layer is not illustrated in FIG. 5.

Figure 7:
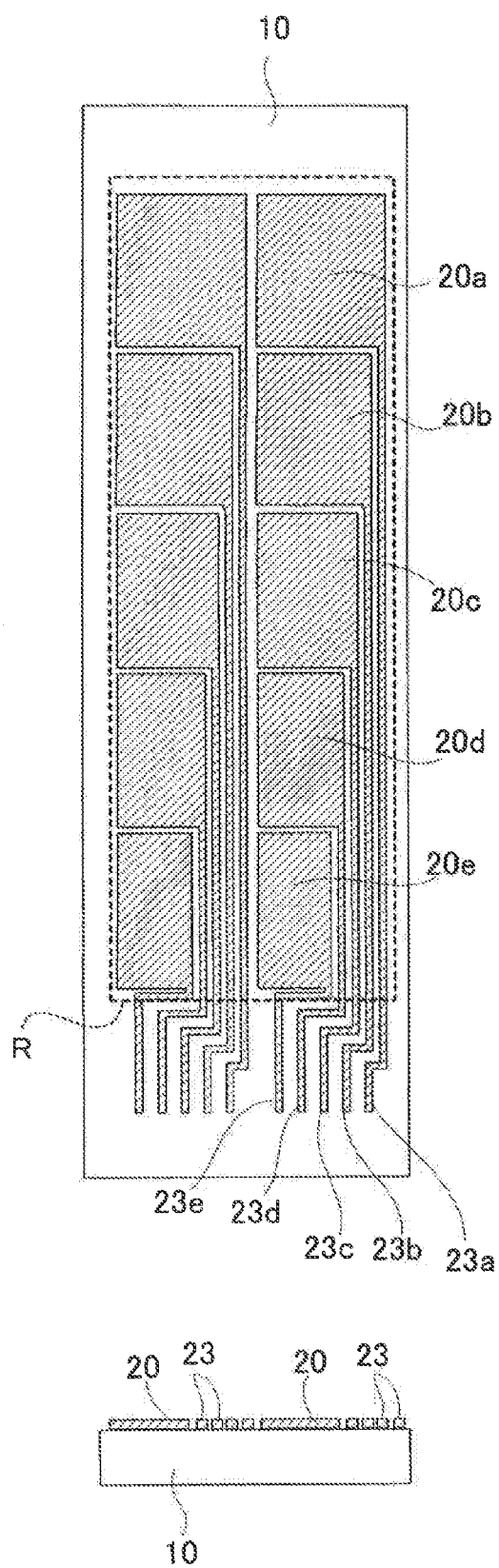
FIG. 7 A plan view and a cross-sectional view showing a production method of the touch switch in FIG. 5.

The touch switch according to the Second Embodiment is a capacitive touch switch provided on an upper face of a display device such as a liquid-crystal panel. As shown in FIG. 5 and FIG. 6, the touch switch has a transparent substrate 10 on which the sensor electrodes 20 (first electrode), the insulating layer 30, the auxiliary electrodes 40 (second electrode), and the protection layer 50 are layered on each other in this order. A plurality of rectangular sensor electrodes 20 are formed on the substrate 10, residing in a reference region R to be touched with fingers, conductive touch pens, and the like. Further, as shown in FIG. 7, each sensor electrode 20 is integrally connected to a linearly extending wire portion 23. The wire portion 23 extends toward the end portion of the substrate 10, and the other end of the wire portion 23 is connected to a capacitance detection circuit (not illustrated in the figure). Considering its length and the width, the wire portion 23 preferably has a low resistance. For example, the surface resistivity is preferably not more than 10 Ω/sq. In the present embodiment, 10 sensor electrodes 20 are provided on the substrate 10; more specifically, two lines of 5 sensor electrodes 20 are aligned in the column-wise direction of FIG. 5 and FIG. 7. Here, for convenience, these 5 sensor electrodes 20 are referred to as first to fifth sensor electrodes 20a to 20e from the top to bottom of FIG. 5 and FIG. 7. Because the 5 sensor electrodes 20 are identical in each line, the sensor electrodes on the right-hand side of FIG. 7 are described below. Further, for convenience, the column-wise direction in FIG. 5 and FIG. 7 is referred to as the longitudinal direction, and the row-wise direction in FIG. 5 and FIG. 7 is referred to as the width direction.

As shown in FIG. 7, the first sensor electrode 20a is provided on one longitudinal end (an upper portion in FIG. 7) of the substrate 10. A wire portion 23a extends straight from the right end of the first sensor electrode 20a toward the other end (a lower portion in FIG. 7) of the longitudinal direction. The second sensor electrode 20b is provided closer to the other longitudinal end than the first sensor electrode 20a. The width-wise length of the second sensor electrode 20b is smaller than that of the first sensor electrode 20a. More specifically, the first and second sensor electrodes 20a and 20b are disposed with their left width-wise ends aligned in line; however, the right end of the second sensor electrode 20b is disposed to the right of the wire portion 23a of the first sensor electrode 20a so that the second sensor electrode 20b does not come in contact with the wire portion 23a of the first sensor electrode 20a. The wire portion 23b of the second sensor electrode 20b extends straight from the right end of the second sensor electrode 20b toward the other end of the longitudinal direction in parallel with the wire portion 23a of the first sensor electrode 20a. Similarly, from the third to fifth sensor electrodes 20c to 20e, the width of the sensor electrode is gradually reduced so as to avoid contact with the wire portions of adjacent sensor electrodes at an end of the longitudinal direction. The fifth sensor electrode 20e has the smallest width. Further, the wire portions 23a to 23e are flexed at an end of the substrate 10 into an L-shape, and thereby ensure large gaps therebetween in the end of the substrate 10.

Figure 8:
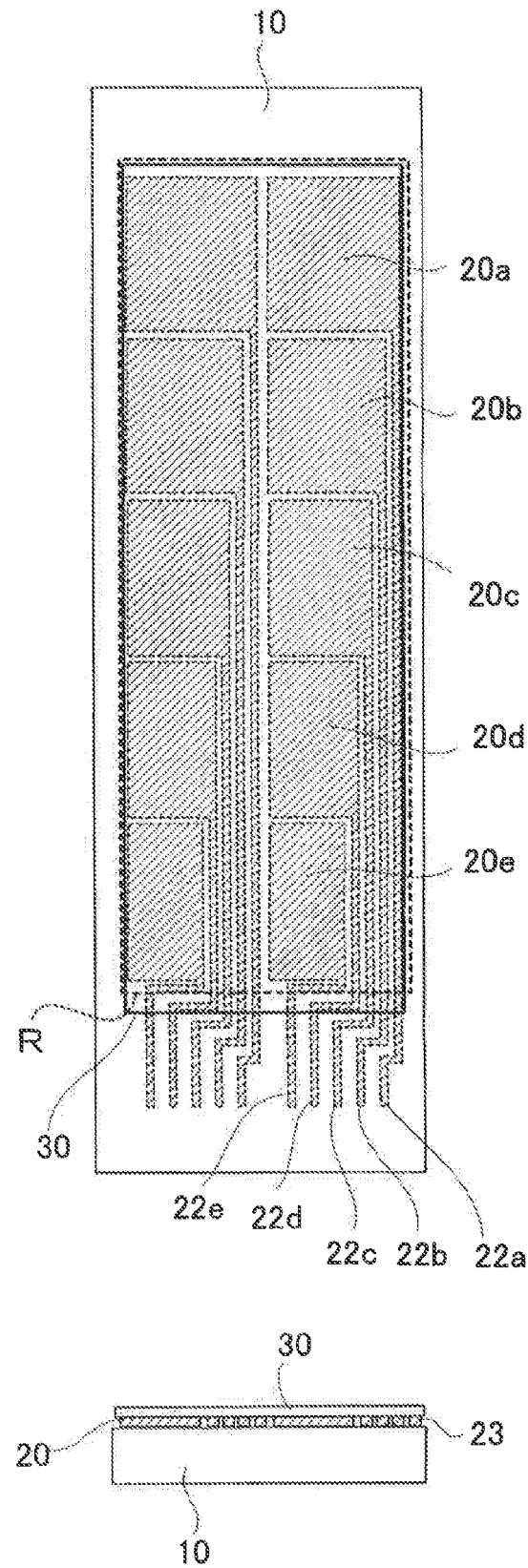
FIG. 8 A plan view and a cross-sectional view showing a production method of the touch switch in FIG. 5.

Further, an insulating layer 30 is formed to cover the sensor electrodes 20a to 20e having the above structure (see FIG. 8). The insulating layer 30 has a film thickness of, for example, 10 to 500 µm, and completely covers the sensor electrodes 20 and the wire portions 23. Further, a plurality of auxiliary electrodes 40 are provided on the insulating layer 30. As with the sensor electrodes 20, 10 auxiliary electrodes 40 are provided. More specifically, two lines of 5 auxiliary electrodes 40 are aligned in the column wise direction of FIG. 5. Similarly to the above description of the sensor electrodes, these 5 auxiliary electrodes 40 are referred to as first to fifth auxiliary electrodes 40a to 40e from the top to bottom of FIG. 5. Because these 5 auxiliary electrodes 40 are identical in each line, the auxiliary electrodes on the right-hand side of FIG. 5 are described below. When the auxiliary electrodes 40a to 40e are made of indium tin oxide (ITO), each of the auxiliary electrodes 40a to 40e has a film thickness of 10 to 100 nm, and is disposed on a corresponding one of the sensor electrodes 20a to 20e on the insulating layer 30. All auxiliary electrodes 40a to 40e are formed into an identical square, and are disposed with narrow intervals. More specifically, as shown in FIG. 6, the boundary "b" of adjacent auxiliary electrodes is disposed in the region L between adjacent sensor electrodes 20. More specifically, the region L between adjacent sensor electrodes 20 is filled with an auxiliary electrode. That is, the wire portion 23 provided between the sensor electrodes 20 is covered by the auxiliary electrode. The surface resistivity of the auxiliary electrodes 40 may be higher than that of the sensor electrodes 20. For example, the surface resistivity is not more than 1 kΩ/sq., more preferably not more than 300 Ω/sq. The auxiliary electrodes 40 are electrically independent, i.e., they are not electrically connected to any other members. The multiple auxiliary electrodes 40 arranged as above are covered with the protection layer 50. The thickness of the protection layer 50 is preferably larger than that of the insulating layer 30. For example, the thickness of the protection layer 50 is 0.5 to 10 mm.

Further, as shown in FIG. 5, the length "s" of an interval between adjacent auxiliary electrodes 40 is 10 µm to 3 mm, preferably 100 µm to 2 mm, and more preferably 0.5 mm to 1.5 mm. A length outside the above range may also be adopted; however, if the interval is 10 µm or less, stable insulation between the adjacent auxiliary electrodes 40 may be impaired. Further, if the interval is 3 mm or more, the low-sensitivity region becomes too large relative to the size of a finger; thus, the detection may become unstable. It is not necessary to equalize the length "s" between the auxiliary electrodes 40 for each of the adjacent auxiliary electrodes 40; for example, the length "s" may vary depending on the position.

Next, the materials of the aforementioned members are described below. The material of the substrate 10 is not limited. The substrate 10 may be made of various materials including transparent inorganic or organic materials, and organic/inorganic hybrid materials. For example, organic materials are preferable in terms of being lightweight and impact resistant, and plastic films are preferable in terms of flexibility and productivity in the roll-to-roll method. Examples of plastic films include polyethylene terephthalate (PET), polyethylene naphthalate (PEN), acryl (PMMA), and polycarbonate (PC). However, these materials are not used untreated, but are processed to be provided with an anchor layer, such as a silane coupling layer, for improved adherence; surface-treated using corona treatment or plasma treatment; or processed to be provided with a hard-coated layer for scratch resistance or improved chemical resistance.

The sensor electrodes 20, the wire portions 23, and the auxiliary electrodes 40 may be formed of various hitherto-known materials, and the materials thereof are not particularly limited. The materials may be selected from preferable materials in view of the desired properties such as electrical connection or transparency. Examples of the materials include metals such as aluminum, silver or copper, and metal oxide materials such as indium tin oxide (ITO), zinc oxide (ZnO), or tin oxide ($SnO_2$). Further, other metals such as aluminum, gallium or titanium may be added to the metal oxide materials. Additionally, organic materials including transparent conductive polymers such as PEDOT/PSS, or metal or carbon fine conductive fibers may also be used as electrode materials solely, or in a combination of two or more. As described above, the surface resistivity of the sensor electrodes 20 and the wire portions 23 is supposed to be low. Therefore, they may have a three-layer structure in which a silver layer is sandwiched between two ITO layers.

The insulating layer 30 is not particularly limited insofar as it is transparent and nonconductive. However, the insulating layer 30 preferably has a high adherence with respect to the auxiliary electrodes 40 and the sensor electrodes 20 respectively disposed thereon and thereunder. As the material of the insulating layer 30, general epoxy or acrylic transparent binders, or adhesives can be adopted. Transparent polyester resin films may also be included. The thickness of the insulating layer 30 is not particularly limited. In practical use, the thickness is preferably not more than 200 µm.

The protection layer 50 may be formed of a hitherto-known transparent material for general touch switches. The protection layer 50 may be formed of, for example, silicon nitride, silicon dioxide, benzocyclobutene (BCB), polyester, acrylic acid, or the like. The protection layer 50 may also be provided with a layer of glass or surface-treated resin film such as PET.

Next, a production method of the touch switch having the above structure is described below in reference to FIGS. 7 to 9. As shown in FIG. 7, a plurality of sensor electrodes 20 and wire portions 23 are formed on the substrate 10. Various methods may be used to form them, including a method of forming the materials of the sensor electrodes 20 and the wire portions 23 on the entire surface of the substrate 10, followed by patterning. Examples of the method of forming the materials include dry coating methods such as vacuum evaporation, sputtering or CVD, and wet coating methods such as gravure coating or spray coating. The patterning method is not limited; however, examples thereof include photolithography and laser etching. Photolithography is a technique of removing films using chemical agents, and laser etching is a technique of removing films using absorption of a laser beam of a specific wavelength. The patterning of the sensor electrodes 20 and the wire portions 23 preferably makes them invisible (i.e., the presence/absence of the electrodes becomes invisible); therefore, it is preferable to perform the patterning using laser etching using YAG third harmonic capable of removing a film of 10 μm or smaller width. Laser etching has advantages over photolithography in terms of, for example, a small environmental burden, reduction in the number of steps due to no use of chemical agents, and convenience in the wiring design due to its patterning from CAD data without using a photomask. It is also possible to form a thin wire pattern using a silver paste or the like by screen printing or the like.

Next, as shown in FIG. 8, the insulating layer 30 is formed by covering the entire area of the sensor electrodes 20 and the wire portions 23. The formation of the insulating layer 30 may be performed using the same method as that for the sensor electrodes 20.

Figure 9:
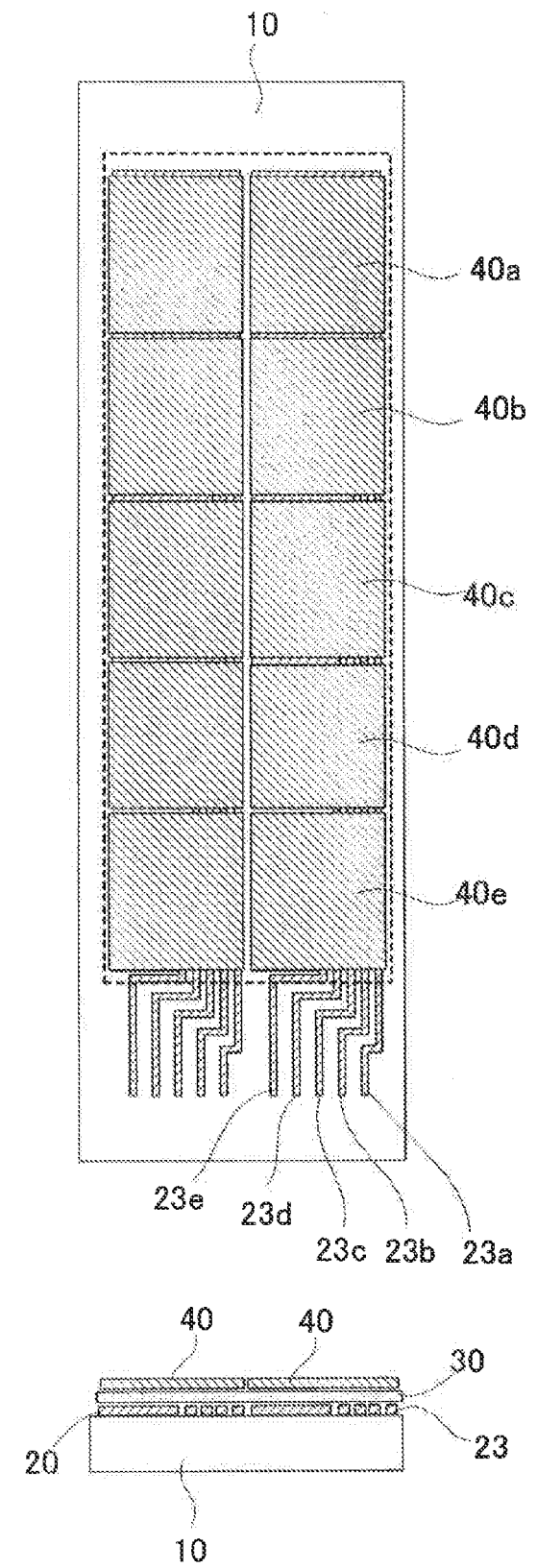
FIG. 9 A plan view and a cross-sectional view showing a production method of the touch switch in FIG. 5.

Next, as shown in FIG. 9, the auxiliary electrodes 40 serving as the second electrodes are formed on the insulating layer 30. The formation of the auxiliary electrodes 40 may be performed using the aforementioned method for forming the sensor electrodes 20. It is necessary to suitably perform the patterning of the sensor electrodes 20, the wire portions 23, and the auxiliary electrodes 40 in an appropriate order in consideration of the materials. Finally, the protection layer 50 is formed on the auxiliary electrodes 40. The protection layer 50 may be formed using a usual method.

Figure 10:
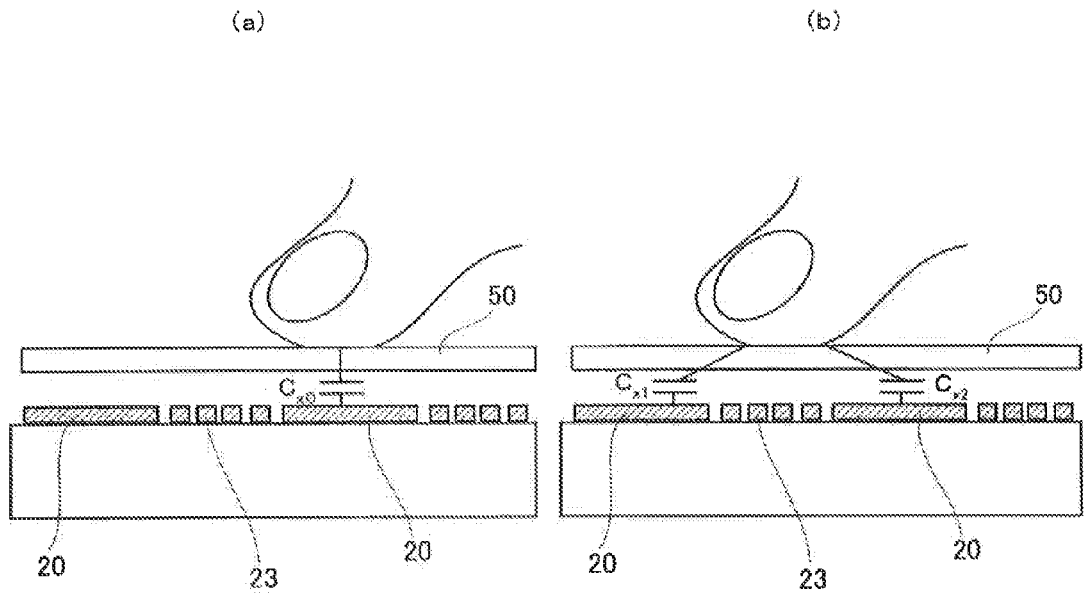
FIG. 10 A drawing showing a sensing mechanism of a hitherto-known touch switch.

The touch switch thus structured is used as follows. The touched portion is detected in the same manner as in the hitherto-known detection technique for the capacitive touch switches; more specifically, a change in electrostatic capacity in response to the user's action of touching an arbitrary portion of the surface of the protection layer 50 with a finger or the like is detected, thereby specifying the touched position. In the above sensing mechanism using the auxiliary electrodes 40, the touch switch operates as follows. First, the hitherto-known touch switch shown in FIG. 10 without an auxiliary electrode is described below. In general touch switches, the electrostatic capacity is proportional to the area in contact with the user's finger placed on the protection layer 50 above the sensor electrodes 20. As shown in FIG. 10(a), because the entire portion touched by the user's finger comes above the sensor electrode 20, the electrostatic capacity $C_{x0}$ is large. On the other hand, as shown in FIG. 10(b), when a portion above the wire portion 23 between the sensor electrodes 20 is touched with a finger, the area of the user's finger above the sensor electrode 20 is small. Accordingly, in this case, the total electrostatic capacity ($C_{x01}+C_{x02}$) of the sensor electrodes 20 is smaller than the electrostatic capacity $C_{x0}$ in FIG. 10(a). Consequently, the sensitivity decreases.

In contrast, the touch switch according to the present embodiment containing the auxiliary electrodes 40 operates as follows. First, as shown in FIG. 11(a), when a portion above the sensor electrode 20 is touched with a finger, the total electrostatic capacity $C_n$ between the finger and the sensor electrode 20 can be denoted by the following Formula (1) wherein $C_0$ represents an electrostatic capacity between the sensor electrode 20 and the auxiliary electrode 40, and $C_{x1}$ represents an electrostatic capacity between the auxiliary electrode 40 and the finger.

$$C_n=C_{x1}/(1+C_{x1}/C_0) \qquad (1)$$

In this case, if the distance between the sensor electrodes 20 and the auxiliary electrodes 40 is sufficiently small, i.e., $C_{x1} \ll C_0$, the results of $C_{x1}/C_0$ in Formula (1) becomes close to 0. That is, $C_n \approx C_{x1}$.

Figure 11:
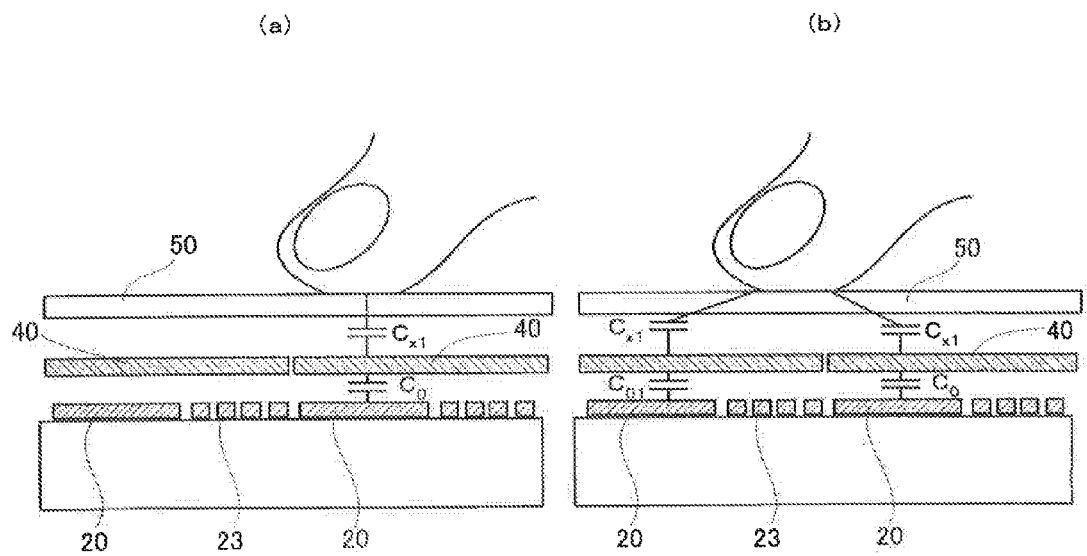
FIG. 11 A drawing showing a sensing mechanism of the touch switch in FIG. 5.

On the other hand, as shown in FIG. 11(b), when the user touches a portion between two adjacent sensor electrodes 20, the touch panel operates differently from that in FIG. 10(b) because of the provision of the auxiliary electrode 4 disposed between the sensor electrodes 20. More specifically, even though the gaps are provided between the auxiliary electrodes 40, these gaps are much smaller than the gaps between the sensor electrodes 20; accordingly, when the user touches a region between the sensor electrodes 20, the adjacent auxiliary electrodes 40 individually corresponding to the sensor electrodes 20 compensate the gaps between the sensor electrodes 20. Therefore, the total electrostatic capacity C, becomes the value denoted by Formula (2) below, which is nearly the same as the electrostatic capacity $C_{x1}$ in FIG. 11(a). Here, $C_{x11}$ is an electrostatic capacity between the finger and one of the auxiliary electrodes, and $C_{x12}$ is an electrostatic capacity between the finger and the other auxiliary electrode.

$$C_n \approx C_{x11}+C_{x12} \approx C_{x1} \qquad (2)$$

In the above embodiment, auxiliary electrodes 40 are formed in the portions opposite the sensor electrodes 20 via the insulating layer 30. With this structure, as shown in FIG. 6, the boundary b of the adjacent auxiliary electrodes 40 resides in a region L between the adjacent sensor electrodes 20. Therefore, even if the wire portions 23 are provided between the sensor electrodes 20 and thereby the low-sensitivity region is enlarged, by disposing the boundary b in the low-sensitivity region, the low-sensitivity region is covered by the auxiliary electrodes 40. Accordingly, the low-sensitivity region is reduced, and the detection sensitivity can be increased even when fingers or conductive touch pens touch the region L between the sensor electrodes 20.

Figure 12:
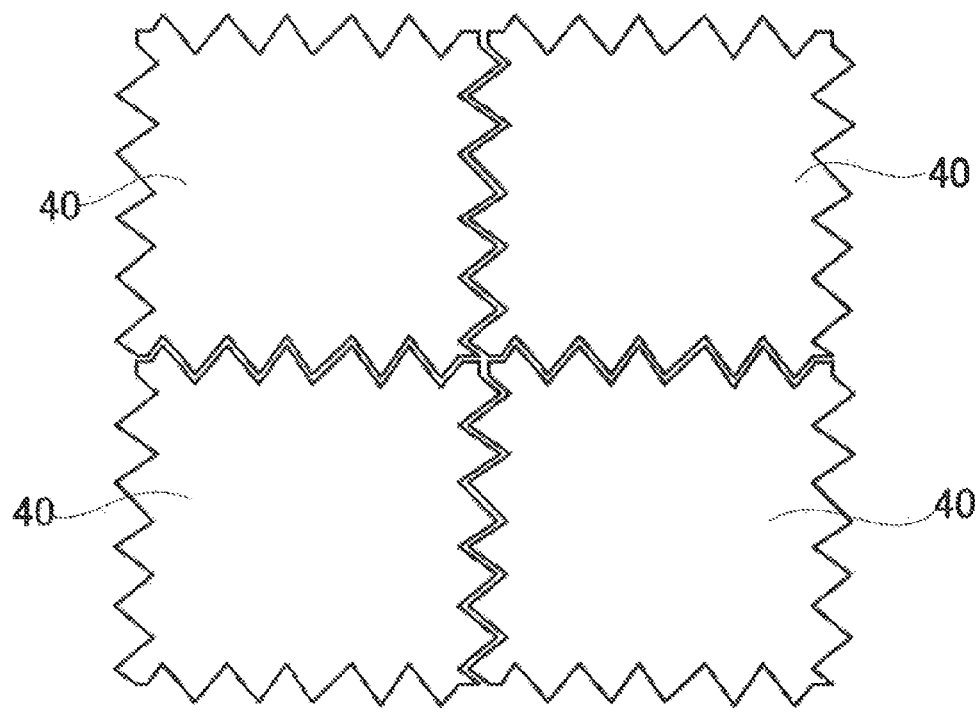
FIG. 12 A plan view showing another example of auxiliary electrodes of the touch switch in FIG. 5.

The present invention is not limited to the preceding Second Embodiment, but embraces all variants within the intended scope of the invention. For example, although the Second Embodiment describes a case where the sensor electrodes 20 and the auxiliary electrodes 40 have rectangular shapes, they may have other various shapes including polygonal, circular, and irregular shapes. Further, although the Second Embodiment describes a case where a linear gap is provided between two adjacent auxiliary electrodes 40, the boundaries between the auxiliary electrodes 40 may be made by forming an in-plane irregular pattern on the edge of each auxiliary electrode 40, and engaging these irregular patterns. For example, as shown in FIG. 12, it is possible to form a plurality of sharp projections on the edges of the auxiliary electrodes 40, and engage them together. With this structure, the detection sensitivity can be increased compared with the case of forming linear gaps between the auxiliary electrodes 40. More specifically, in this structure in which irregular patterns are formed on the edges of the auxiliary electrodes 40, when the user touches a boundary with a finger, the finger is more likely to come in contact with one of the adjacent auxiliary electrodes 40, thereby increasing the detection sensitivity. The irregular patterns are not limited to the above sharp patterns, and can be various shapes including rectangular shapes, corrugated shapes, and the like.

Figure 13:
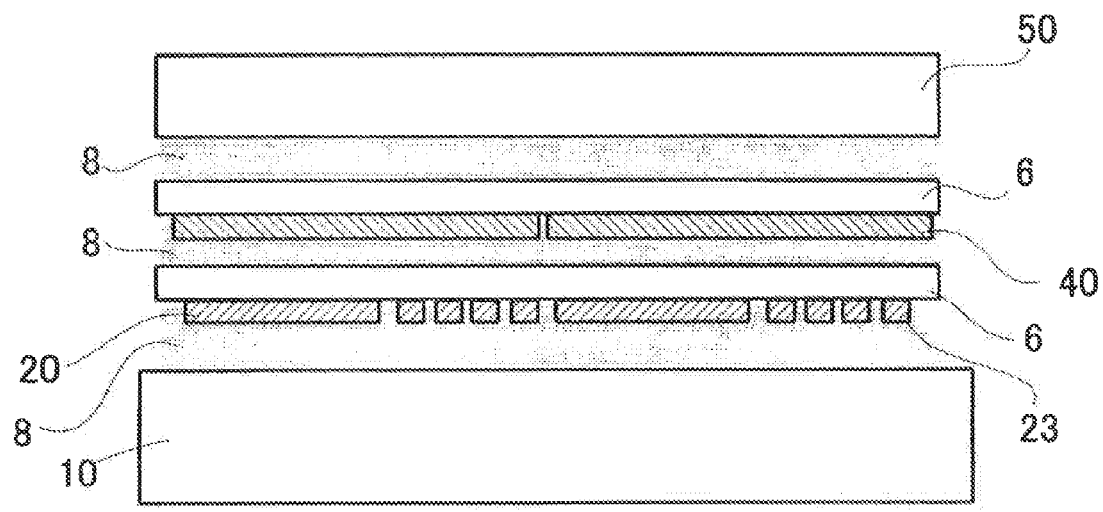
FIG. 13 A cross-sectional view showing another structure example of the touch switch in FIG., 5.

Further, although the Second Embodiment describes a case where the sensor electrodes 20, the wire portions 23, and the auxiliary electrodes 40 are layered on each other untreated, they may be processed into films before being layered. For example, as shown in FIG. 13, an insulating transparent film (PET or the like) 6 on which the sensor electrodes 20 and the wire portions 23 are formed and a similar insulating transparent film 6 on which the auxiliary electrodes 40 are formed are first prepared, and then these films are layered on each other via the insulating adhesive material, together with the substrate 10 and the protection layer 50. The methods for forming the electrodes and the wire portions are the same as those described above. In the example of FIG. 13, the insulating layer of the present invention is composed of the transparent film 6 and the adhesive material 8 disposed between the sensor electrodes 20 and the auxiliary electrodes. Another method is one in which an insulating layer is formed from an insulating transparent film, the sensor electrodes 20 and the wire portions 23 are formed on one surface of the film, the auxiliary electrodes 40 are formed on the other surface, and the resulting lamination is disposed between the substrate 10 and the protection layer 50. In this structure, in which the sensor electrodes 20 and the wire portions 23 are formed on a film, the substrate 10 can be omitted.

Figure 14:
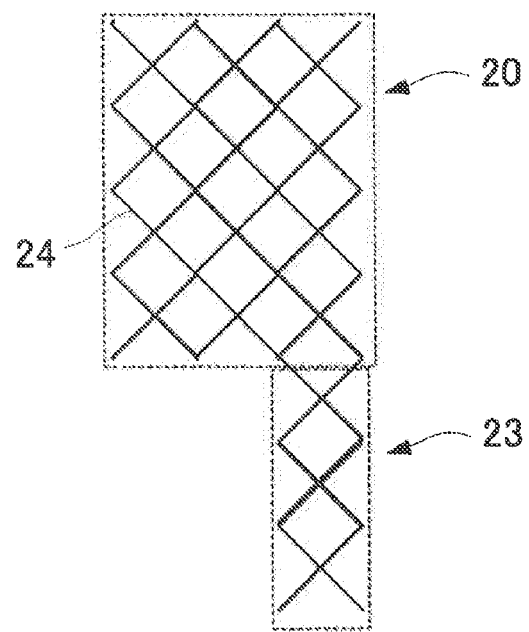
FIG. 14 A plan view showing another example of a sensor electrode of the touch switch in FIG. 5.

Further, the sensor electrodes 20, the wire portions 23, and the auxiliary electrodes 40 may be formed from at least one metal wire. For example, as shown in FIG. 14, the sensor electrodes 20 and the wire portions 23 may be formed as a mesh-type metal wire 24 having a certain area. The wire portions 23 may also be provided as parallel aligned metal wires. The width of the metal wire 24 is, for example, 5 to 50 µm, and the mesh pitch of the metal wire 24 is, for example, 100 to 1000 µm. By forming the electrodes and the wire portions from a metal wire, it is possible to ensure light permeability and reduce surface resistance value.

Further, although the Second Embodiment describes a case of forming a protection layer 50, the protection layer 50 is optional. When the protection layer 50, or a similar film, plate, and the like is formed, the above production method may be performed in a reverse order. For example, the production can be performed by forming the auxiliary electrodes 40, the insulating layer 30, the sensor electrodes 20, the wire portions 23, and the substrate 10 in this order on the protection layer 50. Additionally, in this case, each component can be formed in the same manner as above.

Figure 15:
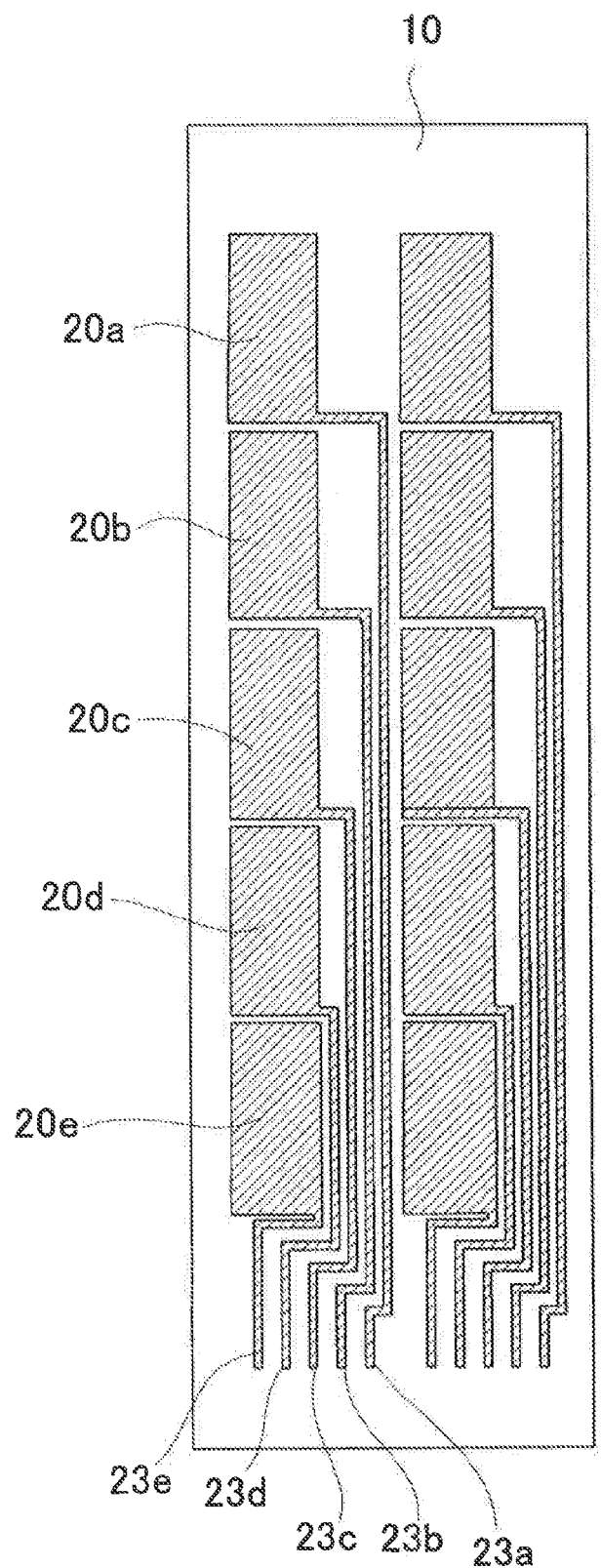
FIG. 15 A plan view showing another example of a sensor electrode of the touch switch in FIG., 5.

Further, although the Second Embodiment describes a case where the sensor electrodes 20 have different areas as shown in FIG. 7, it is also possible to equalize the areas of all sensor electrodes 20, as shown in FIG. 15. With this structure, the electrostatic capacity between each sensor electrode 20 and each auxiliary electrode 40 can be equalized, thereby equalizing detection sensitivity at each detection point.

Hereunder, an example of the Second Embodiment of the present invention is described. However, the Second Embodiment is not limited to the example below.

Figure 16:
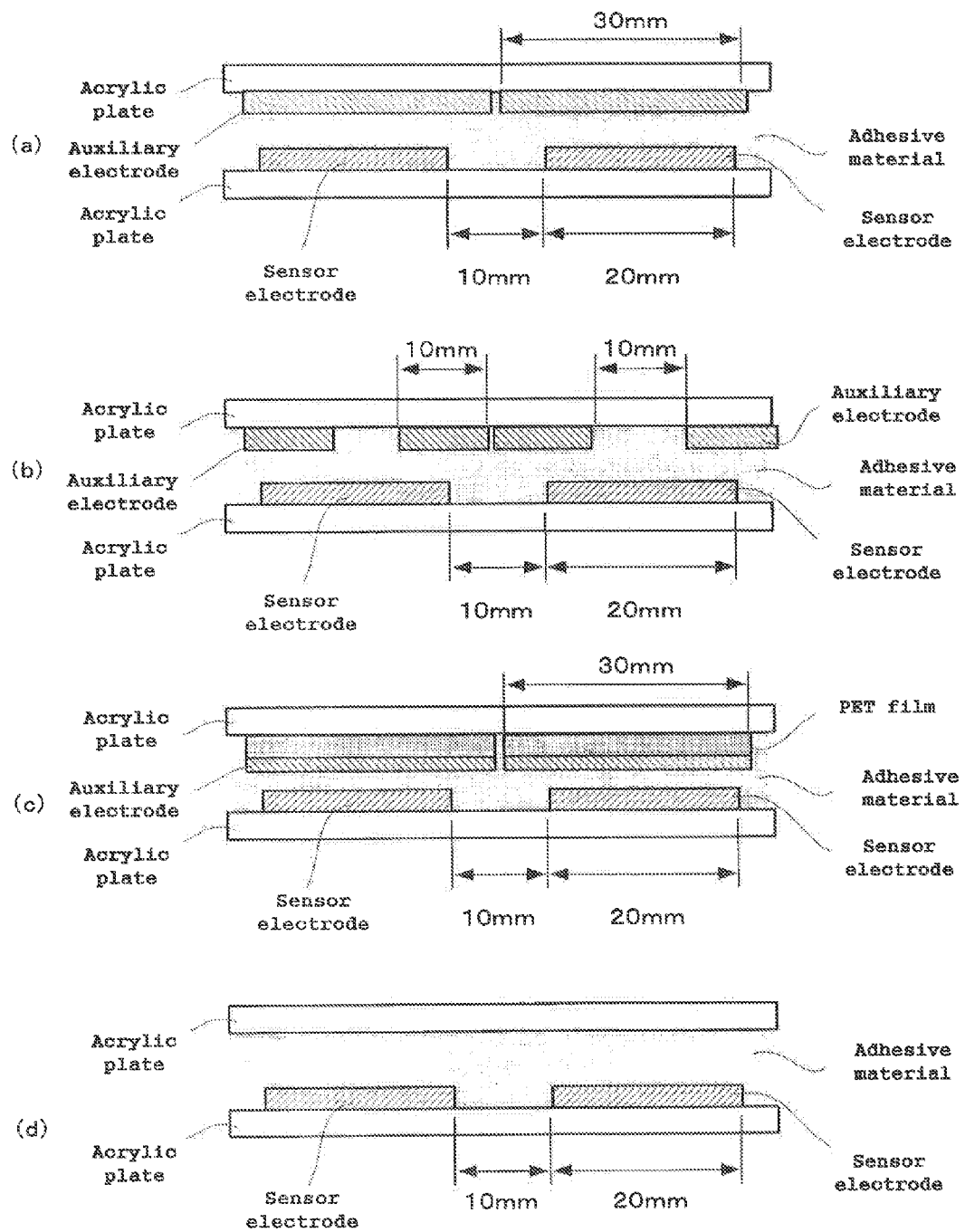
FIG. 16 Cross-sectional views showing Examples and a Comparative Example of the touch switch according to a Second Embodiment of the present invention.

Three examples and a comparative example were produced. FIG. 16(a) shows Example 1. In Example 1, sensor electrodes, each of which is made of a conductive tape having a width of 20 mm, were provided on the upper surface of the lower acrylic plate at an interval of 10 mm. Further, auxiliary electrodes, each of which is made of a conductive tape having a width of 30 mm, were provided on the lower surface of the upper acrylic plate at an interval of 1 mm. The two acrylic plates are fixed by an insulating adhesive material. The boundary of the auxiliary electrodes is disposed between the sensor electrodes. FIG. 16(b) shows Example 2. Example 2 used four auxiliary electrodes having a width of 10 mm. Two of those auxiliary electrodes are disposed in a portion corresponding to the gap between the sensor electrodes, and the remaining two auxiliary electrodes are disposed at the right and left ends of the sensor electrodes. More specifically, the auxiliary electrode is not provided above the region near the center of each sensor electrode. Further, Example 3 shown in FIG. 16(c) used an ITO film as an auxiliary electrode. More specifically, in Example 3, a film obtained by forming ITO on a 125 µm-thick PET film by sputtering was used. The surface resistance value of the ITO film was 250Ω. In the comparative example shown in FIG. 16(d), the auxiliary electrodes are not provided. The materials used in the above examples are as follows.

Conductive tape: Copper foil conductive adhesive tape 8323; Teraoka Seisakusho Co., Ltd.
Binder: ST 415 (120 µm); Sumitomo 3M Ltd.
Acrylic plate: thickness=1 mm Using the above examples and the comparative example, electrostatic capacities were measured when the user touches a portion above the center of a sensor electrode and when the user touches a portion between the sensor electrodes; the values were converted to digital values using a microcomputer (Programmable System-on-Chip (PSoC) CY8C24994-24LTXI) provided by Cypress Semiconductor Corporation. The results are shown below.

TABLE 1

|  | the user touches a portion above the center of a sensor electrode | the user touches a portion between the sensor electrodes |
| --- | --- | --- |
| Example 1 | 308 | 145, 153 |
| Example 2 | 312 | 130, 136 |
| Example 3 | 323 | 155, 145 |
| Comparative Example | 300 | 65, 75 |

The numerical values in the column "the user touches a portion between the sensor electrodes" denote electrostatic capacities separately detected in the two sensor electrodes. The above results revealed that, in Examples 1 to 3, the electrostatic capacities detected in the two sensor electrodes when the user touches a portion between the sensor electrodes were nearly halved. Even in Example 3 using the auxiliary electrodes having a high resistance, the electrostatic capacities in the two sensor electrodes were nearly halved. Therefore, it was revealed that a decrease in detection sensitivity due to the gap between the sensor electrodes can be prevented by providing the auxiliary electrodes for filling the gap. In contrast, in the comparative example without the auxiliary electrodes, the electrostatic capacities in the two sensor electrodes were small.

REFERENCE NUMERALS 1 substrate (base material)
2 wire electrode
20 sensor electrode
21 conductive wire
22 conductive region
23 wire portion
3 insulating layer
30 insulating layer
31 contact hole
4 sensor electrode
40 auxiliary electrode

The invention claimed is:
1. A touch switch comprising:
a substrate;
wire electrodes as a plurality of transparent first electrodes provided on the substrate, each wire electrode having a conductive wire and a conductive area connected to the conductive wire;

an insulating layer that covers the wire electrodes, the insulating layer having at least one contact hole formed on the conductive area of each wire electrode; and sensor electrodes as a plurality of transparent second electrodes provided on the insulating layer, each sensor electrode being provided in a portion corresponding to the conductive area of each wire electrode and being electrically connected to the conductive area via the contact hole, wherein at least a part of each sensor electrode has an edge that forms in-plane irregular patterns, and a boundary of adjacent sensor electrodes is formed by engaging the irregular patterns at predetermined intervals.

2. The touch switch according to claim 1, wherein the sensor electrodes are densely-arranged in an upper portion of a reference region of the substrate where the wire electrodes are provided.

3. The touch switch according to claim 1, wherein gaps between the sensor electrodes are 10 µm to 3 mm.

4. A touch switch comprising:

an insulating layer;

sensor electrodes as a plurality of first electrodes provided on one surface of the insulating layer;

a plurality of wire portions provided on the one surface of the insulating layer, and individually connected to the sensor electrodes; and auxiliary electrodes as a plurality of second electrodes provided on the other surface of the insulating layer, each auxiliary electrode being provided in a portion opposite each sensor electrode, wherein:

a boundary of adjacent auxiliary electrodes is provided in a region between adjacent sensor electrodes, and the auxiliary electrodes are electrically independent.

5. The touch switch according to claim 4, wherein the auxiliary electrodes are densely-arranged in an upper portion of a reference region where the sensor electrodes are provided.

6. The touch switch according to claim 4, wherein gaps between the auxiliary electrodes are 10 µm to 3 mm.

7. The touch switch according to claim 4, wherein the sensor electrodes are formed of a metal wire mesh.

8. The touch switch according to claim 4, wherein the wire portions are formed of at least one metal wire.

9. The touch switch according to claim 4, wherein at least a part of each auxiliary electrode has an edge that forms in-plane irregular patterns, and a boundary of adjacent auxiliary electrodes is formed by engaging the irregular patterns at predetermined intervals.

10. The touch switch according to claim 4, wherein the sensor electrodes have substantially identical areas.

* * * * *